United States Patent
Ng et al.

(10) Patent No.: US 9,331,651 B1
(45) Date of Patent: May 3, 2016

(54) METHOD AND APPARATUS FOR AUTOMATIC GAIN CONTROL IN A CURRENT MODE RF RECEIVER

(71) Applicant: MOTOROLA SOLUTIONS, INC, Schaumburg, IL (US)

(72) Inventors: Jiun How Ng, Pulau Pinang (MY); Chong Hin Chee, Penang (MY); Shafiullah Syed, Parkland, FL (US)

(73) Assignee: MOTOROLA SOLUTIONS, INC., Schaumburg (IL)

( * ) Notice: Subject to any disclaimer, the term of this patent is extended or adjusted under 35 U.S.C. 154(b) by 0 days.

(21) Appl. No.: 14/585,487

(22) Filed: Dec. 30, 2014

(51) Int. Cl.
*H04L 27/08* (2006.01)
*H03G 3/30* (2006.01)
*H03M 1/18* (2006.01)
*H04B 1/10* (2006.01)

(52) U.S. Cl.
CPC ............ *H03G 3/3036* (2013.01); *H03M 1/185* (2013.01); *H04B 1/1036* (2013.01); *H04L 27/08* (2013.01)

(58) Field of Classification Search
CPC . H03G 3/3036; H03G 3/3042; H03G 3/3052; H03G 3/3068; H04L 25/085; H04L 27/08; H04L 27/3809; H03M 1/185
USPC ............... 375/319, 345–346, 350; 455/127.2, 455/232.1, 234.1, 234.2, 239.1, 240.1, 455/245.1, 250.1, 287, 323
See application file for complete search history.

(56) References Cited

U.S. PATENT DOCUMENTS

| | | | |
|---|---|---|---|
| 7,919,952 B1 | 4/2011 | Fahrenbruch | |
| 7,990,201 B2 | 8/2011 | Zhang | |
| 8,027,657 B2 | 9/2011 | Staszewski | |
| 8,810,316 B2 | 8/2014 | Syed | |
| 2002/0086651 A1* | 7/2002 | Prentice | H03F 3/45085 455/234.1 |
| 2006/0057983 A1* | 3/2006 | Thompson | H03D 7/1441 455/127.3 |
| 2007/0054647 A1* | 3/2007 | Hjelm | H03H 11/04 455/287 |
| 2009/0202022 A1* | 8/2009 | Kaczman | H04L 27/3872 375/319 |
| 2009/0203347 A1* | 8/2009 | Kaczman | H03D 7/165 455/326 |
| 2011/0040818 A1 | 2/2011 | Fagg | |
| 2013/0113566 A1* | 5/2013 | Forejt | H03F 3/45179 330/254 |
| 2014/0077788 A1* | 3/2014 | Vemula | G05F 1/613 323/313 |

FOREIGN PATENT DOCUMENTS

EP 2356739 B1 11/2012

OTHER PUBLICATIONS

A Wideband IM3 Cancellation Technique for CMOS -Pi and T-Attenuators, Wei Cheng, Mark S. Oude Alink, Journal of Solid-State Circuits, vol. 48, No. 2, Feb. 2013.

(Continued)

*Primary Examiner* — Khanh C Tran
(74) *Attorney, Agent, or Firm* — Scott M. Garrett; Barbara R. Doutre (57) ABSTRACT

A current mode receiver front end for a radio device converts a received signal into a current mode signal and applies automatic gain control by both shunting current of the current mode signal and providing an adjustable series resistance that further adjust the current level of the current mode signal that is output by the receiver front end. The shunt and series circuits can be controlled by a digital control word whose value represent a decibel value of adjustment, and which is used to drive the shunt and series circuits to achieve both coarse and fine adjustment of the current mode signal.

19 Claims, 6 Drawing Sheets

(56) References Cited

OTHER PUBLICATIONS

Analysis and Design of RF CMOS Attenuators, Hakan Dogan, IEEE Journal of Solid-State Circuits, vol. 43, No. 10, Oct. 2008.

Digitally controlled RF passive attneuator in 65 nm CMOS for mobile TV tuner ICs, A Youssef, International Circuits and Systems, 2010.

Highly Linear RF CMOS variable attenuators with adaptive body biasing, Y Y Huang, IEEE Solid State Circuits vol. 46, No. 5, May 2011.

Saw-less analog front-end receivers for TDD and FDD, Ivan Fabiano, IISCC 2013, Session 5.1 RF Techniques, p. 82, Feb. 2013.

* cited by examiner

METHOD AND APPARATUS FOR AUTOMATIC GAIN CONTROL IN A CURRENT MODE RF RECEIVER

BACKGROUND OF THE INVENTION

The field of radio communications has evolved substantially in order to facilitate various protocols and to address preferences in radio device design. A typical communication device now includes multiple radio transceivers and receivers for various different radio protocols, and users have come to expect being able to communicate over various networks and to have local and personal range connectivity. At the same time, users have preferred smaller devices as they are easier to carry. Accordingly, manufacturers have responded by integrating communication circuitry and reducing the size and weight of communication devices.

One area where meeting user expectations for functionality and form factor has been challenging is in portable two-way radio devices. These devices are used for near-instant communication (i.e. "push to talk") and because of that capability they remain the primary choice for communications among organizations such as police, fire, rescue, and other organizations where rapid communication is desirable. Two-way communications systems have evolved over time, and are now conducted in VHF, UHF, and 800/900 MHz bands. Furthermore, there has been a desire to include certain data communication functionality in these devices as well, such as, for example, the Long Term Evolution (LTE) standard in 700 and 750 MHz bands, among others.

Integrating communications circuits for multiple bands has been accomplished by use of multiple front ends, with one front end for each band, and where each front end is entirely operated in a voltage mode. Separate front ends are used, in part, due to noise considerations while operating in the voltage mode, as well as inherent bandwidth limitations. The desire to reduce the size of portable device has been somewhat enabled by the use of lithium-based battery cells. Rather than using multiple cells connected in series, a single lithium ion battery cell, for example, can provide 3-4 volts, which is sufficient to operate most of the circuitry in a portable device. However, for some RF circuits operating in a voltage mode, a higher voltage is needed. Accordingly, the battery voltage can be stepped up using a switching regulator (e.g. a boost mode regulator). However, switching noise then has to be dealt with, or it can adversely affect receiver sensitivity.

Alternatively, some manufacturers have explored using a current mode front end, where the received signal is converted to a corresponding current signal. This approach has the benefit of being operable at low voltage levels, obviating the need for a voltage boosted in systems powered by a signal battery cell. Furthermore, a current mode front end can be designed to have a low noise figure and is operable over a broader frequency range. However, gain control is typically performed in stages after the current mode stage, in a voltage control mode. It is possible to use elements of the transconductance amplifier for feedback but this has shown to cause DC jumps in the signal level. Furthermore, the die area required to implement even an 8 bit control would be substantial.

Accordingly, there is a need for a method and apparatus for automatic gain control in current mode for a current mode front end of a radio receiver.

BRIEF DESCRIPTION OF THE SEVERAL VIEWS OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

The apparatus and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

DETAILED DESCRIPTION OF THE INVENTION

Embodiments solve the problem of automatic gain control (AGC) in a current mode receiver front end by selectively shunting current and providing selective resistance in series with the current signal output of the transconductance amplifier. Some embodiments include, for example, a current mode AGC circuit for a current mode receiver front end that includes an input for receiving a radio frequency (RF) current mode signal output from a low noise transconductance amplifier (LNTA). The current mode AGC circuit can further include a shunt circuit that shunts current at a selected level from the RF current mode signal to produce a shunted RF current mode signal, and a series circuit that presents a selected resistance to the shunted current mode RF signal to produce a gain adjusted RF current mode signal. The current mode AGC circuit can further include a control circuit that is responsive to a control input that selectively adjusts the shunt circuit and the series circuit.

Figure 1:
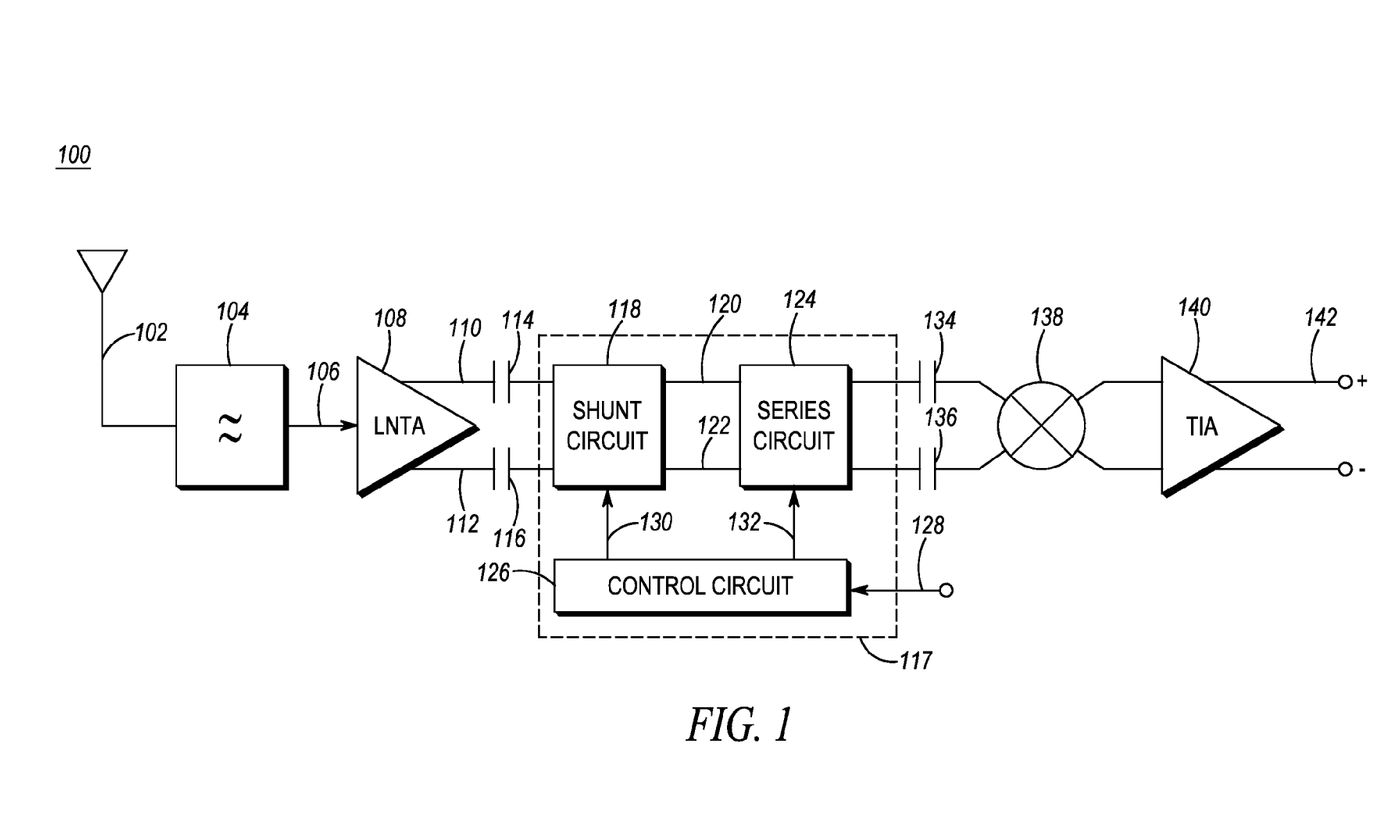
FIG. 1 is a block diagram of a current mode receiver front end with current mode AGC, in accordance with some embodiments.

FIG. 1 is a block diagram of a current mode receiver front end 100 with current mode AGC, in accordance with some embodiments. The front end 100 is suitable for many different radio receiver applications, and can be especially useful in portable two-way radio devices that use a low voltage (i.e.

single battery cell) power source. An antenna 102 collects RF signals in its bandwidth and provides them to an initial processing block 104 that can include a filter and/or a pre-selector. The output 106 of the initial processing block 104 is provided to a low noise transconductance amplifier (LNTA) 108. The LNTA 108 converts the voltage signal at the output 106 of the initial processing block 104 into a current mode signal, which can be provided as a differential between lines 110 and 112. The LNTA 108 in current mode produces a current signal having a low noise figure which also avoids compression issues when interfering signals are present (or nearby in frequency). The differential current signal is fed through a pair of block capacitors 114, 116 into the AGC section 117.

The AGC section 117 includes a shunt circuit 118, a series circuit 124, and a control circuit 126. Although the shunt circuit 118 and series circuit 124 are shown in a particular arrangement here it will be appreciated by those skilled in the art that their positions can be interchanged. The control circuit 126 receives a control input 128, and selectively adjusts the shunt circuit 118 and the series circuit 124. The shunt circuit 118 shunts current at a selected level, thereby reducing the amount of current provided in a shunted current mode signal provided as an output on lines 120, 122, which is provided to the series circuit 124. The series circuit 124 provides an adjustable series resistance to further reduce current and provide a gain adjusted current mode signal as its output, which is fed to a current mode mixer 138 through capacitors 134, 136. The shunt circuit 118 can include a plurality of shunt elements, each of which can shunt a controlled portion of the current provided to the AGC circuit 117 by the LNTA 108, and can be individually controlled by the control circuit to shunt a desired amount of current, thereby reducing the magnitude of the current mode signal provided by the LNTA 108. Likewise, the series circuit 124 can contain a plurality of series elements which can vary in resistance in order to further reduce the effective gain of the current mode signal provided by the LNTA 108. The individual series elements can be variable resistor elements that are controlled by the control circuit 126. In some embodiments the shunt circuit 118 can provide a coarse current adjustment while the series circuit 124 can provide a fine adjustment to adjust current reduction in increments between the increments in current provided by the shunt circuit 118.

The control circuit 126 can receive a control input 128 in the form of a digital word, such as an eight bit (one byte) word, allowing for 256 increments of current reduction in the output of the LNTA 108. In some embodiments this can translate to approximately 44 decibels (dB) of reduction. The control circuit provides control signals to both the shunt circuit 118 and the series circuit 124 in a way that corresponds to the desired gain reduction corresponding to the value of the control input. In some embodiments the control circuit can control the shunt circuit in coarse current adjustment increments and control the series circuit in finer current adjustment increments. The control input 117 can be provided, for example, by a baseband processor (not shown) that processes the output of the transimpedance amplifier 140. It will be appreciated by those skilled in the art that while the shunt circuit 118 is shown as being digitally controlled, and the series circuit 124 is analog controlled in the present example, the shunt circuit can be analog controlled and the series circuit can be digitally controlled. The digital control provides a coarse adjustment while the analog control provides a fine adjustment which is in smaller increments than the course adjustment.

The output of the current mode AGC circuit, which is a RF current mode signal, can be fed to a current mode mixer 138 to down convert the RF current mode signal to a down converted, gain adjusted current mode signal which is fed to the transimpedance amplifier 140. The transimpedance amplifier 140 coverts the down converted, gain adjusted current mode signal to a voltage mode signal 142 that can be processed by a baseband processor or other processing circuitry. The magnitude of the voltage mode signal 142 provided by the transimpedance amplifier 140 can be controlled by providing the appropriate value at the control input 128.

Figure 2:
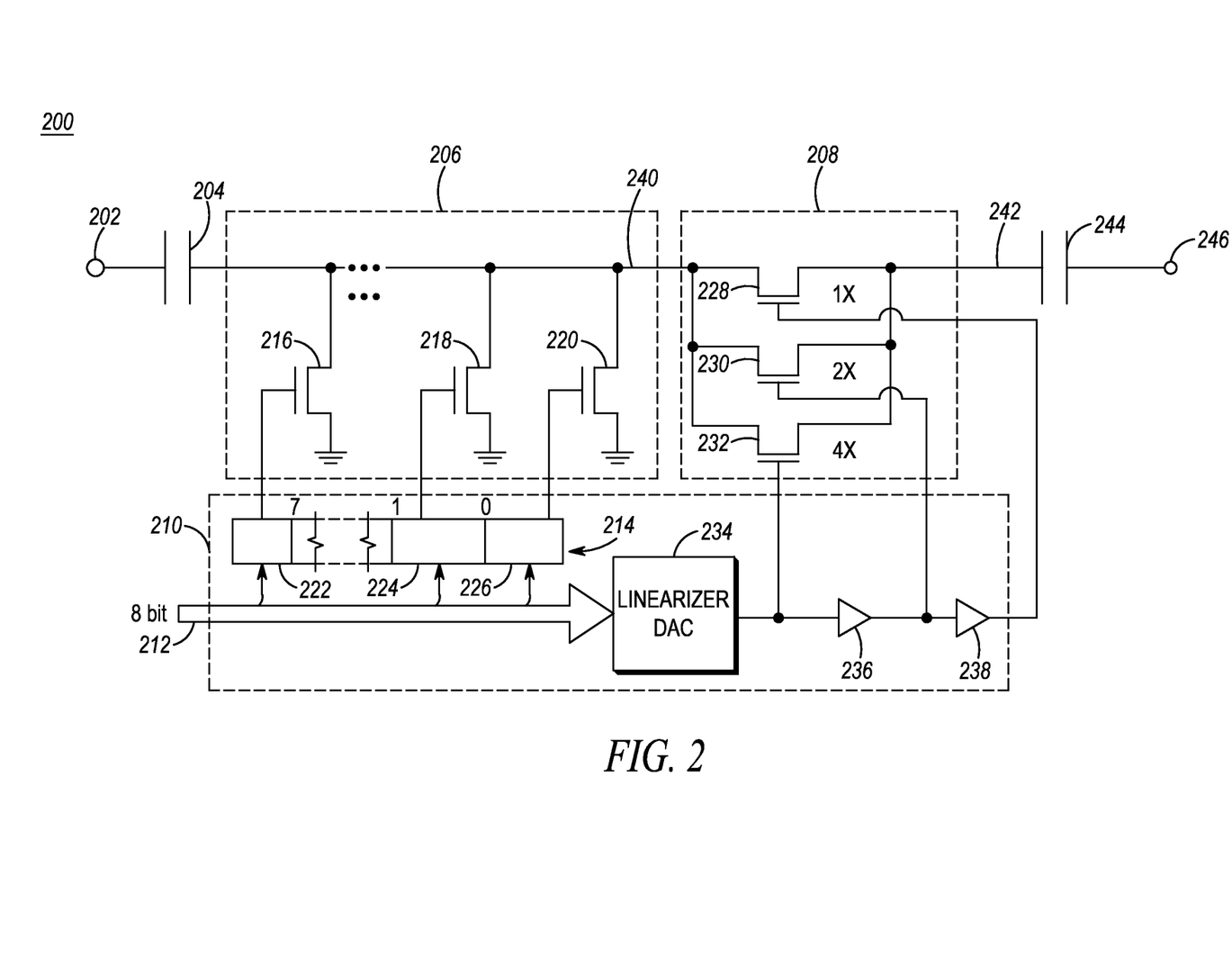
FIG. 2 is a schematic diagram of a current mode AGC circuit, in accordance with some embodiments.

FIG. 2 is a schematic diagram of a current mode AGC circuit 200, in accordance with some embodiments. A current mode RF signal is provided to an input 202 from a LNTA, and passes through a blocking capacitor 204. The current mode AGC circuit includes a shunt circuit 206, a series circuit 208, and a control circuit 210 which is responsive to a control input 212. The control input can be a digital word, such as an 8 bit value, that corresponds to an amount of attenuation to apply to the current mode RF signal provided at the input 202, relative to the resulting signal provided at an output 246 of the current mode AGC circuit 200.

The control circuit can include a latch 214 or similar logic in which the control input digital word is written. Each bit of the latch/decoder 214 controls a respective one of a plurality of shunt elements such as shunt elements 216, 218, 220 (three are shown, but 256 would be present in total in this example). The latch/decoder 214 also decodes the digital word to $2^n$ outputs, where each output controls an individual shunt element. Thus, an 8 bit control word allows for control of 256 shunt elements such as exemplary shunt elements 216, 218, 220. Thus latch/decoder cells 222, 224, 226 control shunt elements 216, 218, and 220, respectively. The shunt elements 216, 218, 220 can be field effect transistors (FETs) such as complementary metallic oxide semiconductor (CMOS) FETs. The shunt elements 216, 218, 220 are controlled between either a fully off state (i.e. non-conductive) or a resistive state. When set to being fully off, they do not shunt any current from the current mode RF signal. To shunt current from the current mode RF signal, the individual shunt elements can be selectively turned on to their resistive state to shunt a portion of current from the current mode RF signal. In some embodiments each shunt element 216, 218, 220 can have a different resistance value corresponding to its respective latch cell position. Thus, for example, shunt element 220 can have a resistance normalized to a value of one, shunt element 218 can have a normalized resistance value of two, the next shunt element (not shown) a value of four, up to shunt element 216 which can have a normalized resistance of 128. By using a digital word, a combination of resistance can be selected that corresponds with a desired shunt current to be shunted from the current mode RF signal by combining 1×, 2×, 4×, 8× . . . 128× resistance values accordingly. Although it is preferred to apply a control voltage to each shunt element to cause the transistor to operate at the desired resistance in order to reduce die size in an integrated circuit, it will be appreciated by those skilled in the art that each shunt element can be implemented as a transistor switch and a series resistance of the appropriate resistance value in applications where die size is not a concern. Furthermore, the shunt element can shunt the signal to a reference potential, or it can shunt the differential signal lines together in some embodiments.

Accordingly, the shunt circuit 206 can reduce the current provided in the current mode RF signal at the input 202 by shunting current from the current mode RF signal. At line 240 a shunted RF current mode signal results. In some embodiments the shunt circuit 206 performs a coarse adjustment, and additional finer adjustment is needed. The series circuit 208 can introduce a series resistance to adjust the amount of shunted current that passes through the shunt circuit 206. The series circuit can contain a plurality of series elements such as series element 228, 230, 232. As with the shunt elements 216, 218, 220, the series elements 228, 230, 232 can be implemented as CMOS FET devices that are operated as either being fully on (i.e. minimum on resistance—essentially a short circuit), or in a selected resistance state to resist the flow of current, causing more current to flow through the shunt circuit 206. The series elements 228, 230, 232 are controlled by a digital to analog (D/A) converter and linearizer 234 which converts the received digital word control input 212 to an analog value. The direct output of the D/A linearizer 234 controls series element 232. A first gain stage 236 increases the output of the D/A linearizer 234 by a selected gain factor to provide an output that control series element 230. A second gain stage 238 further increases the output of the D/A linearizer 234, by applying a gain factor to the output of the first gain stage 236, to control series element 228. Thus, as the output of the D/A linearizer changes, the collective resistance of the series elements 228, 230, 232 changes. The D/A linearizer 234 converts the control input to an output according to a linearized scale, rather than being proportional to the value of the control input, so that the change in resistance of the series elements 228, 230, 232 is linear. This means the output of the D/A linearizer 234 must be "warped" to reflect the non-linear control voltage that must be applied to each series element to achieve linear resistance change over the range of resistance provided by the series circuit 208. As a result, the shunt elements 216, 218, 220 are operated discretely, meaning they are either off or on at a selected resistance, whereas the series elements are controlled in an analog manner over a range of resistance. As a result a gain adjusted RF current mode signal results on line 242, which is fed through an output DC blocking capacitor 244 to an output 246.

Figure 3:
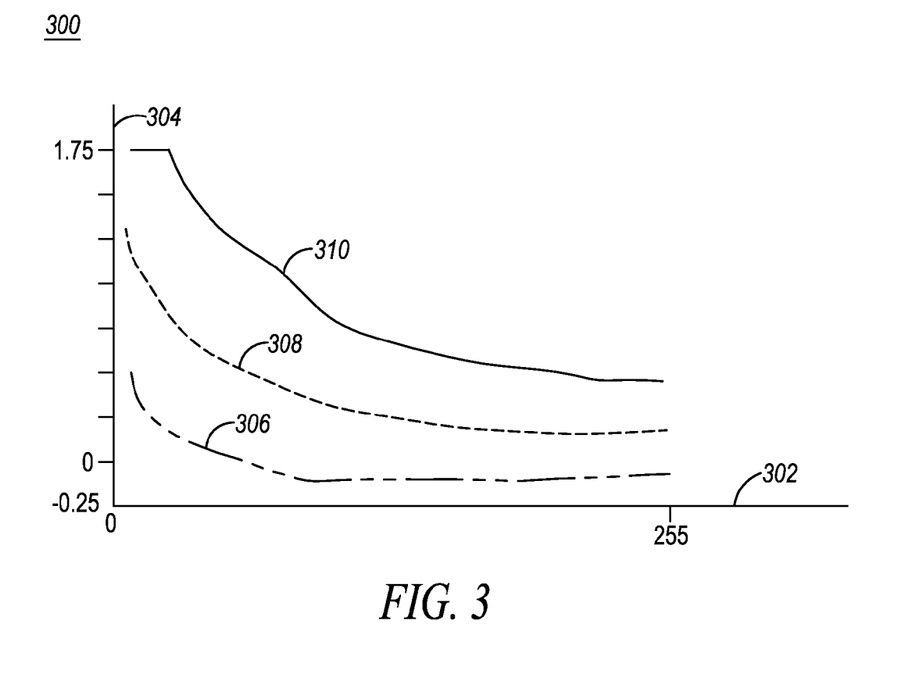
FIG. 3 is a graph chart of gate-source voltages for series elements in a current mode AGC circuit, in accordance with some embodiments.

FIG. 3 is a graph chart 300 of gate-source voltages for series elements in a current mode AGC circuit, in accordance with some embodiments. In particular the graph chart 300 shows how the voltage output of a D/A linearizer (e.g. 234) is "warped" in order to achieve a linear control of the resistance of series elements for AGC operation. The horizontal axis represent the value of the control input, such as control input 212 of FIG. 2, which can be a byte-wide digital value. The vertical axis 304 represent the voltage provided to a respective series element. Voltage curve 306, for example, can be the direct output of a D/A linearizer, which can be provided to a series element such as series element 232. Voltage curve 308 represents the output of a first gain stage such as first gain stage 236, which is provided to series element 230. Voltage curve 310 represents the output of a second gain stage such as second gain stage 238, which is provided to series element 228. Note that the voltage curve 306 is warped to be non-linear relative to the control input value 302. The series elements, when there is no current mode attenuation being applied (i.e. a control input value of 0), provide essentially a short circuit, and their respective control voltage is at its highest level (assuming N-type FET transistor devices). As the control value increases, the voltage provided at the gate of each respective series element decreases in a way that results in an overall linear increase in resistance for each respective series element. As a result, for example, series element 232 can experience a normalized 4× change in resistance relative to series element 228, and series element 230 can experience a 2× increase in resistance relative to series element 228 over the range of control input values.

Figure 4:
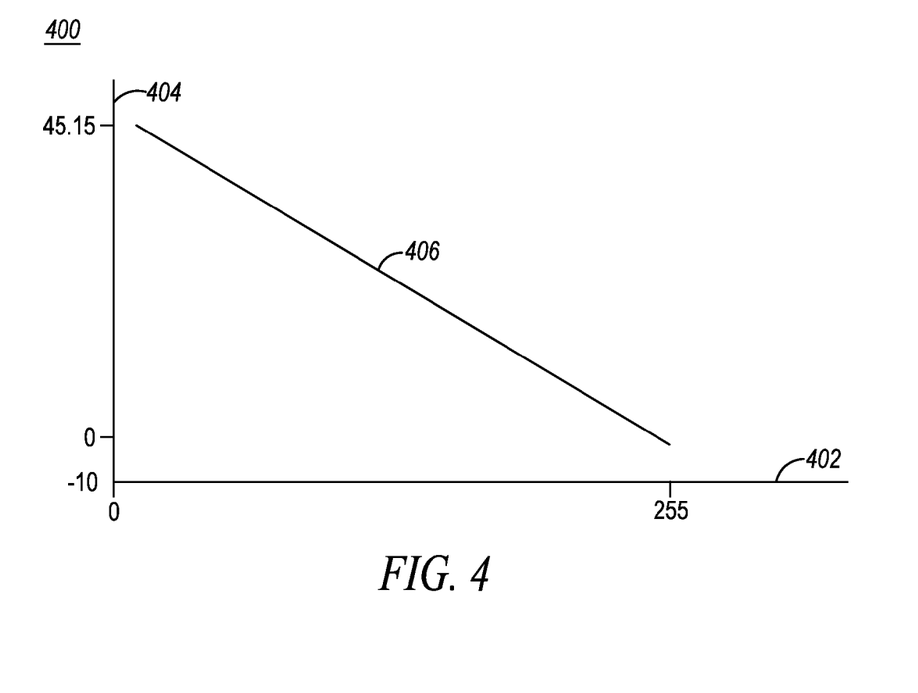
FIG. 4 is a graph chart of attenuation in a current mode AGC circuit versus digital control value, in accordance with some embodiments.

FIG. 4 is a graph chart 400 of attenuation in a current mode AGC circuit versus digital control value, in accordance with some embodiments. In particular the graph chart can show the effect of a current mode AGC circuit such as that exemplified in FIG. 2. The horizontal axis 402 represents the value of the control input to the control circuit, and here has a value range of 0-255, corresponding to an eight digit binary value (i.e. one byte). The vertical axis 404 represents attenuation in decibels. As a result of the linearizer, the effect of the shunt circuit and the series circuit is a linear attenuation response 406 over the value of the control input. This allows a device using, for example, the current mode receiver front end of FIG. 1 to control attenuation linearly. Given conventional CMOS process fabrication a current mode ACG circuit can provide on the order of 45 dB of attenuation using an 8 bit implementation.

Figure 5:
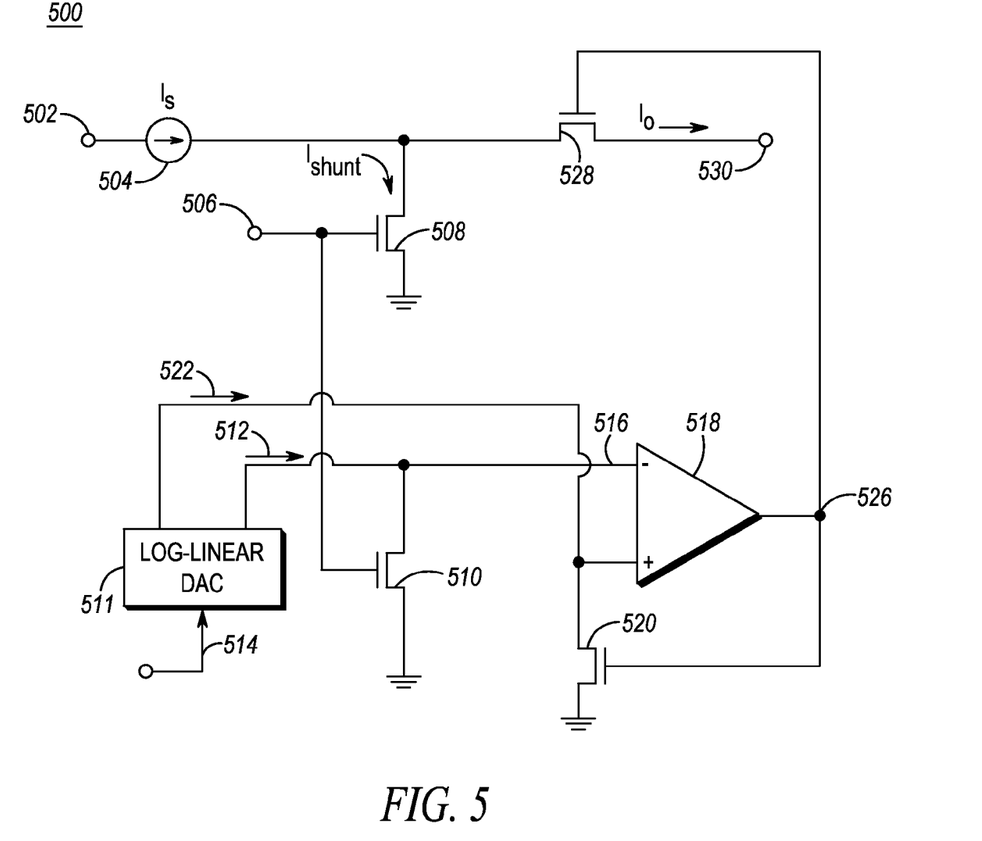
FIG. 5 is a schematic diagram for a linearizer circuit for a series element in a current mode AGC circuit, in accordance with some embodiments.

FIG. 5 is a schematic diagram for a linearizer circuit 500 for a series element in a current mode AGC circuit, in accordance with some embodiments. The linearizer circuit 500 can represent one portion of a D/A linearizer such as D/A linearizer 234 of FIG. 1. The D/A linearizer converts the digital value 514 of the control input to analog currents. The analog values of the linearizer drive a differential transistor pair to convert the analog values into a first current and a second current in log-linear form. The first current represents a current level of the shunted current mode signal and the second current represents a current value of the gain adjusted current mode signal. A difference current, being the difference between the first current and the second current, is applied to a replica of a shunt element of the shunt circuit. The replica of the shunt element has an input connected to an input of the shunt element. A voltage across the replica shunt element is used to produce a control voltage to control a corresponding one of the plurality of series elements.

Accordingly, a signal current $I_s$ 504 is provided at an input 502 of the current mode AGC circuit. A control input is applied to input 506, which controls a shunt element 508, turning it on to a selected shunt current value $I_{shunt}$. The control input 506 is a voltage resulting from the digital control word 514 that is output by, for example, a decoder (e.g. latch/decoder 214 of FIG. 2). A log linear digital to analog converter (DAC) 511 receives the digital control word 514 and produces a pair of analog currents 512, 522 in correspondence to the value of the digital control word 514 in a log linear relationship. A replica shunt element 510 is provided with a difference current 512 produced by the log linear DAC 511 by subtracting a replica output current $I'_o$ from a replica signal current $I'_s$, resulting in a voltage on line 516 (and across replica shunt element 510) which is fed to the inverting input of an op-amp 518. The log linear DAC 511 also produces a current 522 at the $I'_o$ level which is provided to a replica of a series element 520 to produce a voltage at the non-inverting input of the op-amp 518. The op-amp 518 produces an output voltage 526 that adjusts the resistance of the replica series element 520 such that it has a resistance sufficient to generate a voltage equivalent to that on line 516, given current 522. The output voltage 526 is applied to a series element 528 that is in series with the current mode RF signal, and which is controlled to the same resistance as that of the replica series element 520.

The analog currents 512, 522 produced by the log linear DAC 511 are proportional to the digital control word 514 with a log-linear relationship. The digital control word 514 can be expressed in decibels, and as the value of the digital control word 514 increases $I'_o$ decreases, and thus $I_{shunt}$ (though shunt elements such as shunt element 508) increases. Accordingly, it will be understood that, in the present example, as the value of the digital control word 514 increases it switches on an increasing number of shunt elements such as shunt element 508, and corresponding replica shunt elements such as replica shunt element 510. The current flowing through the replica shunt elements that are thereby turned on produce the voltage on line 516, which replicates the voltage produced across shunt elements including shunt element 508. Op-amp 518 drives its output 526 to turn replica series element 520 on to the extent that current 522 ($I'_o$) will produce the same voltage as produced by replica shut element 510. Likewise, output 526 drives output series element 528 to the same extent as replica series element 520 is biased to only allow output current $I_o$. Output series element 528 is therefore driven in a way that maintains a ratio of $I_o/I_{shunt}$ such that it is equal to $I'_o/I'_{shunt}$, and this ratio is expressed in decibels (dB). As a result, a gain adjusted current mode signal is provided at the output 530. The op-amp 518 sets up a feedback loop that measures the voltage across the replica shunt elements 510 and control the conductance of the series elements 520 such that the voltage across it matches that of the shunt elements 508. Therefore the voltage output 526 is at a level that results in the current $I_o$ through the series element(s) 528. The output 530 is coupled to a transimpedance amplifier, which acts as a virtual ground.

Figure 6:
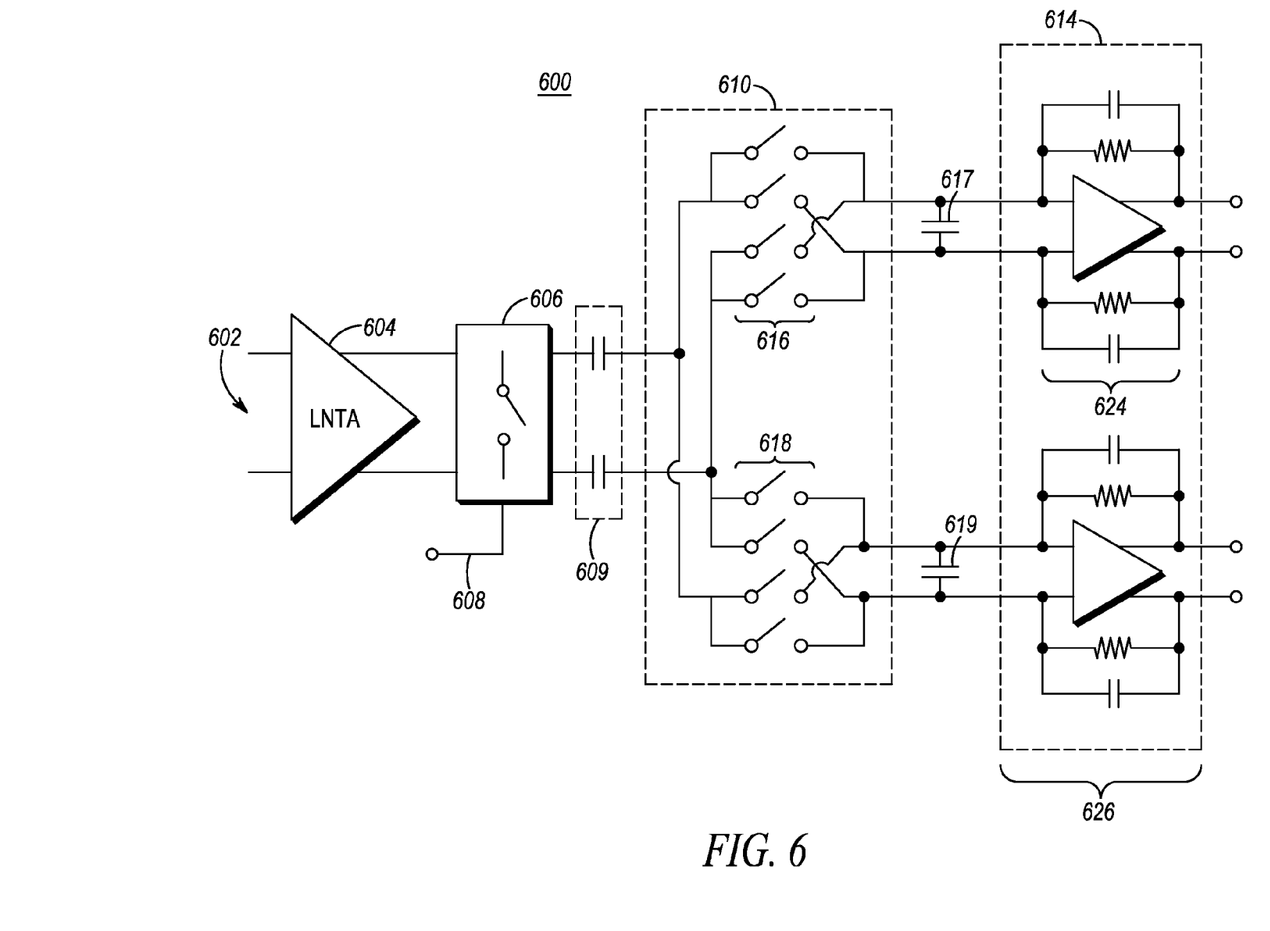
FIG. 6 is a block schematic diagram for a current mode AGC circuit partially implemented in a current commutating mixer, in accordance with some embodiments.

FIG. 6 is a block schematic diagram for a current mode AGC circuit 600 partially implemented in a current commutating mixer, in accordance with some embodiments. In FIG. 1, the mixer 138 is in line after the current mode AGC circuit 117, but in some embodiments a portion of the current mode AGC circuit can be integrated into a mixer. Since in current mode a mixer can be implemented as commutating series switches, a series switch can be replaced by a resistance to accomplish a dual effect; mixing and current attenuation.

An input voltage mode signal 602 is converted into a current mode RF signal by a LNTA 604. The output of the LNTA 604 is fed to a shunt circuit 606, which is operated by a control input signal 608. The shunt circuit 606 shunts current from the output of the LNTA 604 to a selected shunt level. The output of the LNTA 604 is a differential output, each different signal providing an in-phase and quadrature phase signal that have a quadrature phase relationship. The upper differential signal can include I and Q components while the lower differential signal can include I' and Q' components. The shunt circuit 606 can apply equal shunting to both the differential current mode signals. The differential current mode signals, after shunting in shunt circuit 606, pass through blocking caps 609 to a current mode sampling mixer 610 with variable resistance control. An upper commutating switch bank 616 can mix the I and Q current mode signals while a lower commutating switch bank 618 can mix the I' and Q' current mode signals which are 180 degrees out of phase with their counterpart I and Q signals. Both of the differential current mode signals are mixed with a local oscillator signal and corresponding quadrature oscillator signals that can be applied to the gate of the switches in the switch banks 616, 618. Furthermore, a DC bias applied to each of the switches in the switch banks 616, 618 can be controlled in accordance with a current mode series switch element so that rather than operating as pure switches, where they are switched either on or off, they are switched to a selected resistive state in the same way as series elements 228, 230, 232 for FIG. 2. Storage capacitors 617, 619 act as sample and hold elements to facilitate current sampling and also provide low pass filtering to filter out harmonics produced by sampling in the commutating switch bank 618.

The output of the current sampling mixer 610 is coupled to respective transimpedance amplifiers 624, 626 in an amplifier section 614. The transimpedance amplifiers convert the downconverted and gain adjusted current mode signals output from the current sampling mixer 610 into a corresponding baseband voltage I and Q, and I' and Q' signals. The voltage I and Q, and I' and Q' baseband signals can be processed by a baseband processor to extract information and to determine an appropriate AGC value for the current mode AGC circuit.

Figure 7:
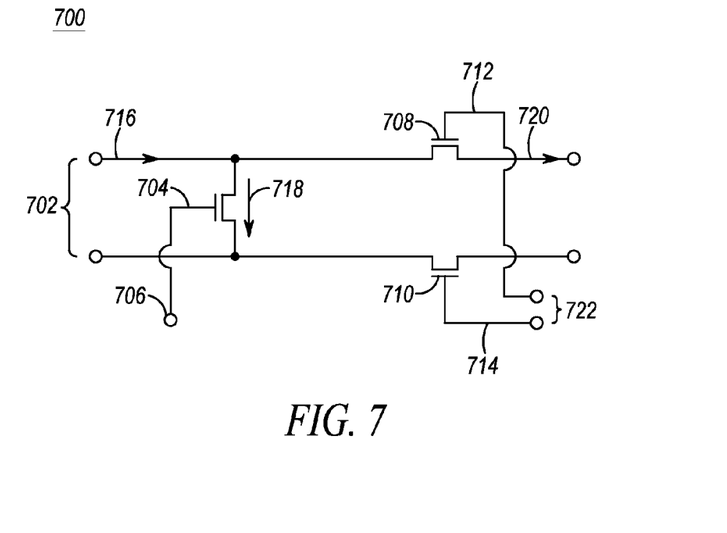
FIG. 7 is a schematic diagram for a current commutating mixer element including AGC control in a current mode receiver front end, in accordance with some embodiments.

FIG. 7 is a schematic diagram for a current commutating mixer element 700 that includes AGC functionality in a current mode receiver front end, in accordance with some embodiments. The current commutating mixer element 700 can be, for example, used in a commutating mixer such as current commutating mixer 610 of FIG. 6 for mixing one I or Q component (or I' or Q' component) of the current mode differential signal provided by the LNTA 604. A current mode RF signal 716 can be applied to an input 702. A shunt element 704 is controlled to allow a shunt current 718 to pass through it at a selected level to attenuate the input RF current mode signal 716. Series elements 708, 710 act as both mixer elements and series AGC elements. Their input control voltage 722 is applied to their respective gates 712, 714, and can include both a local oscillator signal and a AGC bias that causes them to operate in a resistive state rather than being fully on or fully off. This arrangement reduces the series elements by avoiding separate AGC and mixer series elements. The output 720 provides a mixed or down converted gain adjusted current mode signal.

Figure 8:
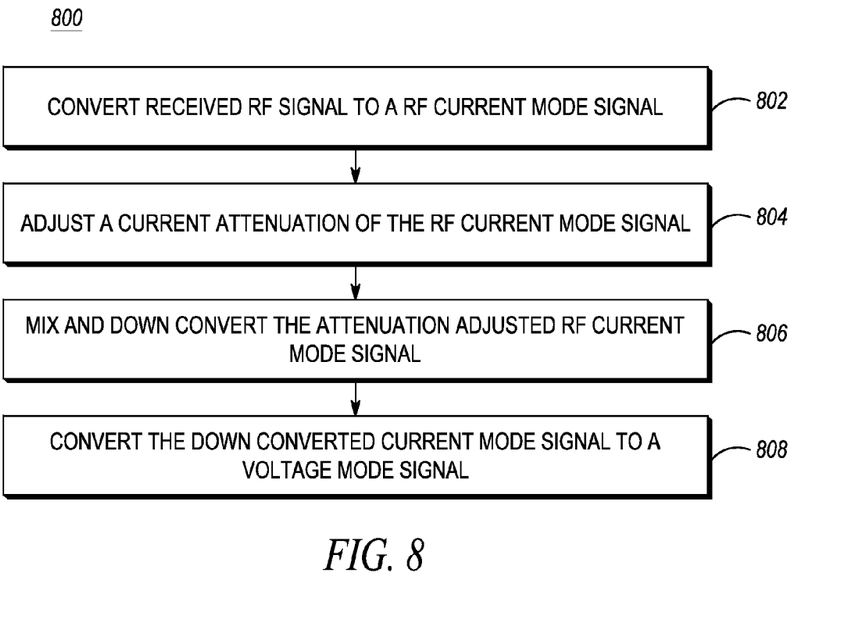
FIG. 8 is a flow chart diagram of a method for processing a received signal in a current mode receiver front end, in accordance with some embodiments.

FIG. 8 is a flow chart diagram of a method 800 for processing a received signal in a current mode receiver front end, in accordance with some embodiments. The method 800 represents the processes undertaken by, for example, the receiver front end 100 of FIG. 1. In step 802 a RF signal is received via, for example, an antenna or other signal collecting element. The received signal is converted into a RF current mode signal, which is a current mode version of the received signal, after some initial processing (i.e. filtering and amplification). In step 804 a current mode attenuation is applied to the RF current mode signal in accordance with an AGC setting, as determined farther downstream in the receiver lineup. The current attenuation can be performed by combining shunting elements and series elements. In step 806 the attenuated RF current mode signal is mixed and downconverted to produce a downconverted current mode signal. In some embodiments the mixing and attenuation functions can be performed using the same series elements rather than using separate series elements for attenuation and mixing functions. In step 808 the downconverted current mode signal is converted into a voltage mode signal for further processing by the receiver, which can determine whether the AGC setting needs to be adjusted for step 804.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has", "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially", "essentially", "approximately", "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

It will be appreciated that some embodiments may be comprised of one or more generic or specialized processors (or "processing devices") such as microprocessors, digital signal processors, customized processors and field programmable gate arrays (FPGAs) and unique stored program instructions (including both software and firmware) that control the one or more processors to implement, in conjunction with certain non-processor circuits, some, most, or all of the functions of the method and/or apparatus described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used.

Moreover, an embodiment can be implemented as a computer-readable storage medium having computer readable code stored thereon for programming a computer (e.g., comprising a processor) to perform a method as described and claimed herein. Examples of such computer-readable storage mediums include, but are not limited to, a hard disk, a CD-ROM, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory) and a Flash memory. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

We claim:

1. A current mode automatic gain control circuit for a current mode receiver front end comprising:
   an input that receives a radio frequency (RF) current mode signal output from a low noise transconductance amplifier;
   a shunt circuit that shunts current at a selected level from the RF current mode signal to produce a shunted RF current mode signal;
   a series circuit that presents a selected resistance to the shunted current mode RF signal to produce a gain adjusted RF current mode signal; and
   a control circuit that is responsive to a control input that selectively adjusts the shunt circuit and the series circuit.

2. The current mode automatic gain control circuit of claim 1, wherein the control input is a digital word comprised of a plurality of bits, the shunt circuit comprises a plurality of shunt elements wherein each shunt element is controlled responsive to a different one of the plurality of bits of the digital word.

3. The current mode automatic gain control circuit of claim 2, wherein each of the plurality of shunt elements shunt an amount of current from the RF current mode signal proportional to its respective one of the plurality of bits.

4. The current mode automatic gain control circuit of claim 1, wherein the shunt circuit comprises a plurality of shunt elements that are each individually enabled to provide a resistive shunt path from the RF current mode signal to a reference potential.

5. The current mode automatic gain control circuit of claim 1, wherein the control input is a digital word comprised of a plurality of bits, the series circuit comprises a plurality of series elements connected in parallel, wherein the control circuit enables a number of the plurality of series elements in proportion to a value of the digital word.

6. The current mode automatic gain control circuit of claim 1, wherein each of the plurality of series elements has a control terminal, the control circuit comprises:
   a linearizer that converts the digital word to an analog value; and
   at least one gain element that amplifies the analog value thereby providing at least two gain nodes that provide corresponding gain levels of the analog value;
   wherein the control terminal of each of the plurality of series elements is connected to a respective one of the at least two gain nodes.

7. The current mode automatic gain control circuit of claim 6, wherein a digital to analog converter (DAC) converts the control input, which is a digital word, into a first current and a second current in log-linear form, wherein the first current represents a current level of the shunted current mode signal and the second current represents a current value of the gain adjusted current mode signal, the first current is applied to a replica of a shunt element of the shunt circuit, the replica of the shunt element having an input connected to an input of the shunt element, and wherein a voltage across the replica shunt element is used to produce a control voltage to control a corresponding one of the plurality of series element.

8. The current mode automatic gain control circuit of claim 1, wherein the shunt circuit provides a coarse adjustment of a gain of the RF current mode signal and the series circuit provides a fine adjustment of the RF current mode signal.

9. The current mode automatic gain control circuit of claim 1, wherein the shunt circuit is controlled by a digital value and the series circuit is controlled by an analog voltage level.

10. The current mode automatic gain control circuit of claim 1, wherein the control input is a digital word that corresponds to a gain setting in decibels, the control circuit is configured to adjust the shunt circuit and the series circuit in correspondence with the digital word such that a gain adjustment from the RF current mode signal to the gain adjusted RF current mode signal corresponds to a decibel value corresponding to the digital word.

11. A current mode receiver front end comprising:
  a low noise transconductance amplifier that converts a received voltage signal to a corresponding radio frequency (RF) current mode signal;
  a current mode automatic gain control circuit that applies a current gain adjustment to the RF current mode signal to produce a gain adjusted RF current mode signal, wherein the current mode automatic gain control circuit comprises:
    a shunt circuit that shunts current at a selected level from the RF current mode signal to produce a shunted RF current mode signal;
    a series circuit that presents a selected resistance to the shunted current mode RF signal to produce the gain adjusted RF current mode signal; and
    a control circuit that is responsive to a control input that selectively adjusts the shunt circuit and the series circuit;
  a current commutating mixer that downconverts the gain adjusted RF current signal to produce a downconverted current mode signal; and
  a transimpedance amplifier that converts the downconverted current mode signal to a voltage signal.

12. The current mode receiver front end of claim 11, wherein the control input is a digital word comprised of a plurality of bits, the series circuit comprises a plurality of series elements connected in parallel, wherein the control circuit enables a number of the plurality of series elements in proportion to a value of the digital word.

13. The current mode receiver front end of claim 11, wherein each of the plurality of series elements has a control terminal, the control circuit comprises:
  a linearizer that converts the digital word to an analog value; and
  at least one gain element that amplifies the analog value thereby providing at least two gain nodes that provide corresponding gain levels of the analog value;
  wherein the control terminal of each of the plurality of series elements is connected to a respective one of the at least two gain nodes.

14. The current mode receiver front end of claim 13, wherein the analog value of the linearizer drives a differential transistor pair to convert the analog value into a first current and a second current in log-linear form, wherein the first current represents a current level of the shunted current mode signal and the second current represents a current value of the gain adjusted current mode signal, a difference current being the difference between the first current and the second current is applied to a replica of a shunt element of the shunt circuit, the replica of the shunt element having an input connected to an input of the shunt element, and wherein a voltage across the replica shunt element is used to produce a control voltage to control a corresponding one of the plurality of series element.

15. The current mode receiver front end of claim 11, wherein the control input is a digital word that corresponds to a gain setting in decibels, the control circuit is configured to adjust the shunt circuit and the series circuit in correspondence with the digital word such that a gain adjustment from the RF current mode signal to the gain adjusted RF current mode signal corresponds to a decibel value corresponding to the digital word.

16. A method for processing a received signal in a current mode receiver front end, the method comprising:
  converting a received radio (RF) signal into a RF current mode signal at a low noise transconductance amplifier;
  adjusting a current gain of the RF current mode signal to a gain adjusted RF current mode signal by a selected gain factor, wherein adjusting the current gain of the RF current mode signal comprises:
    controlling a shunt circuit that selectively shunts current from the RF current mode signal to a selected shunt level to produce a shunted RF current mode signal; and
    controlling a series circuit that selectively resists the shunted RF current mode signal by a selected resistance to produce the gain adjusted RF current mode signal;
  downconverting the gain adjusted RF current mode signal to a downconverted current mode signal; and
  converting the downconverted current mode signal to a voltage signal.

17. The method of claim 16, wherein:
  controlling the shunt circuit comprises controlling a plurality of shunt elements for a coarse current adjustment; and
  controlling the series circuit comprises controlling a plurality of series elements for a fine current adjustment.

18. A method for processing a received signal in a current mode receiver front end, the method comprising:
  converting a received radio (RF) signal into a RF current mode signal at a low noise transconductance amplifier;
  adjusting a current gain of the RF current mode signal to a gain adjusted RF current mode signal by a selected gain factor, wherein adjusting the current gain of the RF current mode signal is performed by a current mode automatic gain control circuit that receives a digital word as a gain control input adjusting the current gain of the RF current mode signal in proportion to the digital word to produce the gain adjusted RF current mode signal;
  downconverting the gain adjusted RF current mode signal to a downconverted current mode signal; and
  converting the downconverted current mode signal to a voltage signal.

19. A current mode receiver front end, comprising:
  a low noise transconductance amplifier that converts a received voltage signal to a corresponding radio frequency (RF) current mode signal;
  a current mode attenuator that diverts the RF current mode signal to ground to produce an attenuated RF current mode signal;

a current commutating mixer that downconverts the attenuated RF current signal to produce a downconverted current mode signal; and a transimpedance amplifier that converts the downconverted current mode signal to a voltage signal.

* * * * *